US008680462B2

(12) United States Patent
Zanon et al.

(10) Patent No.: US 8,680,462 B2
(45) Date of Patent: Mar. 25, 2014

(54) CURVED HEATED ION TRANSFER OPTICS

(75) Inventors: Stephen Zanon, Campbell, CA (US);
Roy P Moeller, San Leandro, CA (US);
Urs Steiner, Branford, CT (US);
Felician Muntean, Danville, CA (US)

(73) Assignee: Bruker Daltonics, Inc., Billerica, MA (US)

( * ) Notice: Subject to any disclaimer, the term of this patent is extended or adjusted under 35 U.S.C. 154(b) by 63 days.

(21) Appl. No.: 13/370,513

(22) Filed: Feb. 10, 2012

(65) Prior Publication Data
US 2013/0015348 A1   Jan. 17, 2013

Related U.S. Application Data

(60) Provisional application No. 61/508,565, filed on Jul. 15, 2011, provisional application No. 61/508,005, filed on Jul. 14, 2011.

(51) Int. Cl.
*H01J 49/06* (2006.01)
(52) U.S. Cl.
USPC ............................ 250/283; 250/281; 250/288
(58) Field of Classification Search
USPC .......................................................... 250/283
See application file for complete search history.

(56) References Cited

U.S. PATENT DOCUMENTS

| 4,963,736 | A | 10/1990 | Douglas |
| 5,559,327 | A | 9/1996 | Steiner |
| 5,652,427 | A | 7/1997 | Whitehouse |
| 5,852,302 | A | 12/1998 | Hiraishi et al. |
| 6,576,897 | B1 | 6/2003 | Steiner |
| 6,797,948 | B1 | 9/2004 | Wang |
| 2006/0192109 | A1 | 8/2006 | Mannino et al. |
| 2009/0206250 | A1* | 8/2009 | Wollnik ........................ 250/290 |
| 2009/0242747 | A1* | 10/2009 | Guckenberger et al. ...... 250/281 |
| 2010/0327156 | A1 | 12/2010 | King |

FOREIGN PATENT DOCUMENTS

GB   2490792 A1   11/2012

\* cited by examiner

*Primary Examiner* — Phillip A Johnston
(74) *Attorney, Agent, or Firm* — Robic, LLP

(57) ABSTRACT

An ion optics assembly is formed by four quarter-circular profile elements, all of which are attach to the same reference plate. Consequently, all four elements remain aligned to the same reference plate. The four elements form a quarter-circular channel with quarter-circular quad electrodes. The quad electrodes receive electrical potential to form the field required to focus and maintain the ions at the center of the channel. Quarter-circular insulators are provided on all sides of the channel so as to seal the channel over its length from the interior of the mass spectrometer. A heater is provided at the entrance to the ion transfer optics, to prevent accumulation of ions on the poles. A thermal break is provided in the quad, so as to enable maintaining the front of the quad heated and the rest of the quad cooler.

21 Claims, 4 Drawing Sheets

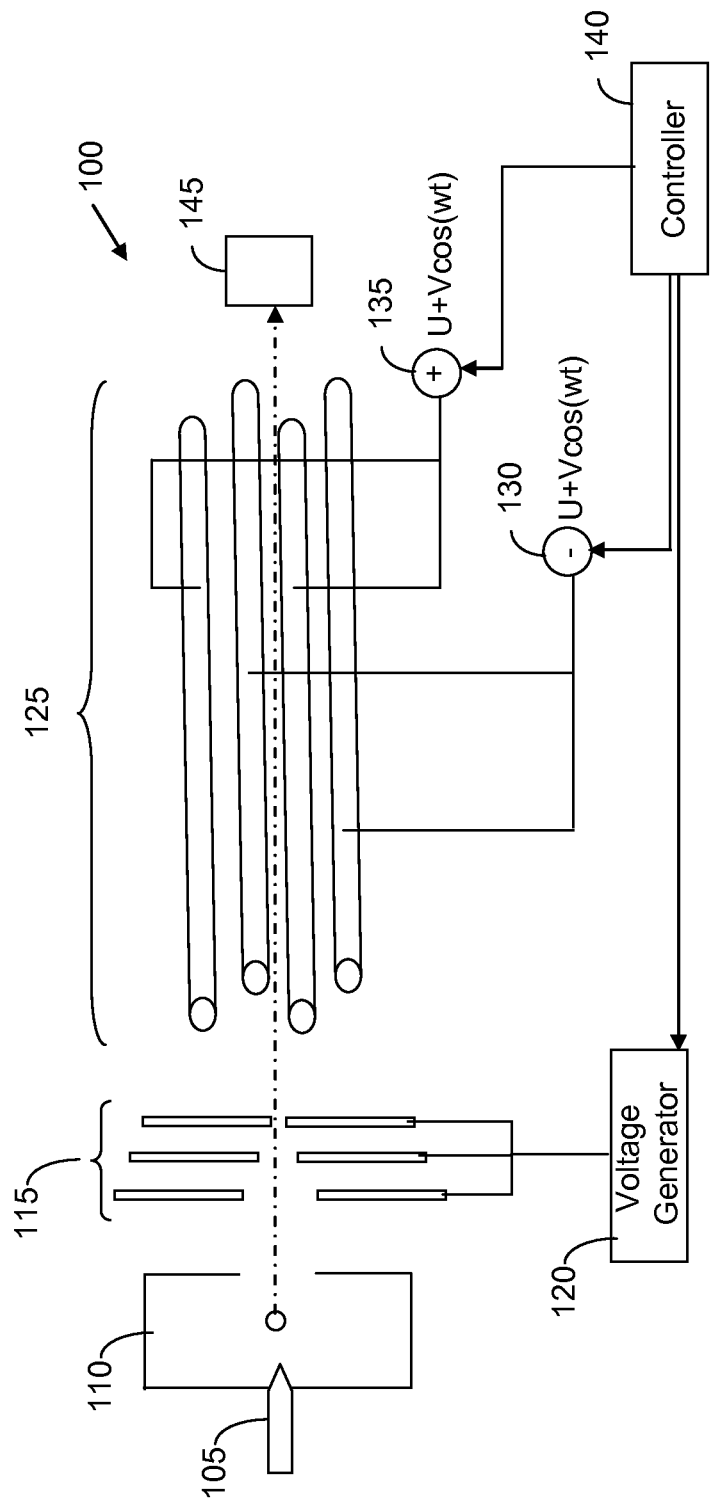
*Figure 1 – Prior Art*

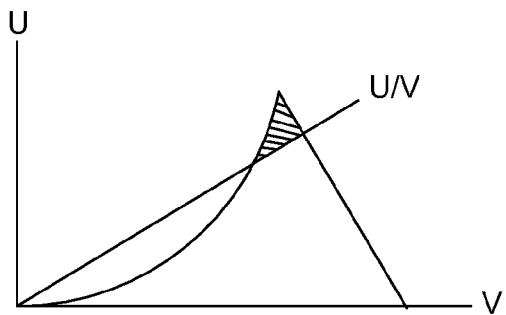
Figure 2 – Prior Art
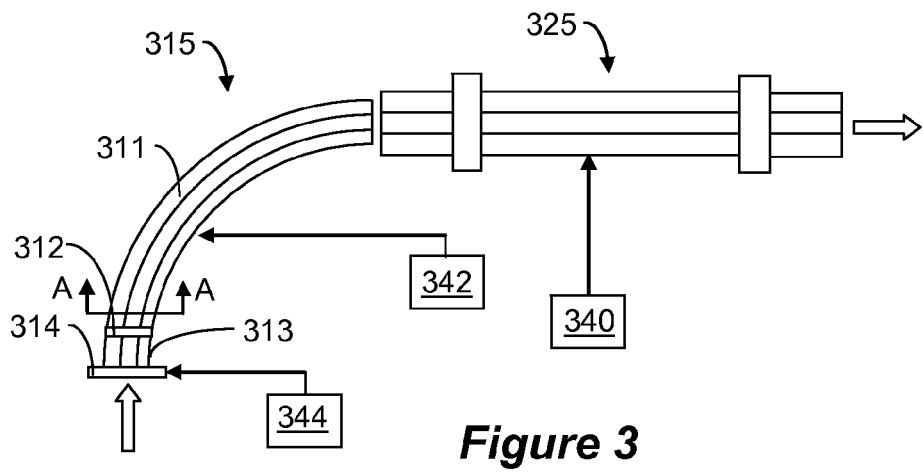
Figure 3
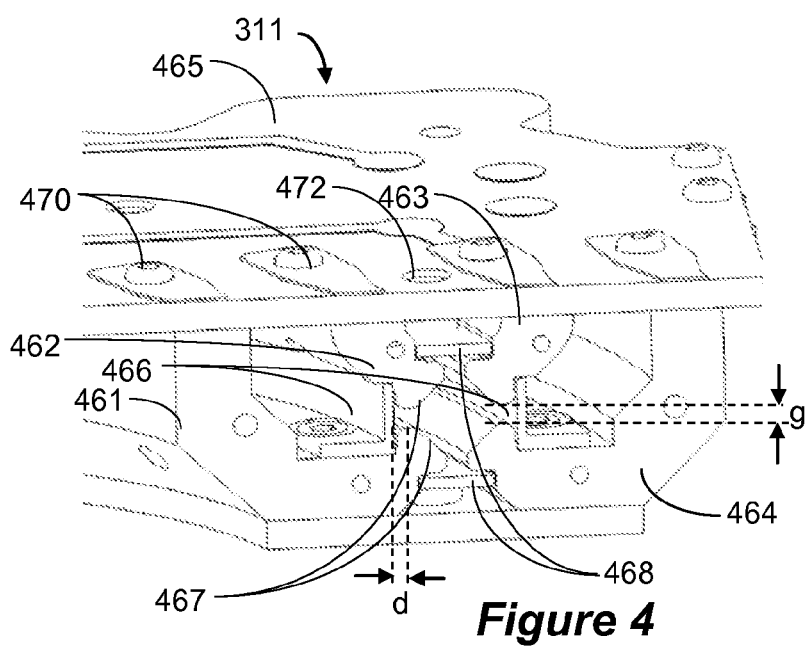
Figure 4

CURVED HEATED ION TRANSFER OPTICS

BACKGROUND

This application is in the field of mass spectrometers and, more specifically, relates to a mass analyzing spectrometer and a method for fabricating curved, heated ion transfer optics. Various mass spectrometers are known in the art. An example of a prior art multi-pole mass spectrometer is illustrated in FIG. 1. For convenience of description, the mass spectrometer example of FIG. 1 is specific to a quadrupole mass analyzer; however embodiments of the invention may be used in other types of mass analyzers. In the mass spectrometer of FIG. 1, the sample molecules are delivered, e.g., by injector 105, into an ionization chamber 110, which ionizes the molecules, thereby acting as an ion source 110. Ions from the ion source 110 are focused and transferred to the mass analyzer 125 via ion guide or transfer optics 115, which is driven by voltage generator 120.

As shown in FIG. 1, four conductive rods, constituting the quadrupole mass analyzer 125, are arranged in two pairs, each pair receiving the same DC+RF signal, denoted as U+V cos (wt), wherein U is the magnitude of the DC voltage while V is the magnitude of the RF signal. One pair of rods receives a positive DC signal at zero phase, while the other receives a negative DC signal at 180 degrees phase (−[U+V cos(wt)]), thereby acting as a band pass separating the ions according to their mass to charge ratio, generally denoted as m/z. This relationship is illustrated in FIG. 2, wherein the shaded area denotes the band-pass wherein only ions having a mass to charge ratio (m/z) within the shaded area may pass the mass analyzer. The width of the band pass is controlled by the signal applied to the rods, such that the narrower the band pass is, the higher the resolution of the mass spectrometer.

By scanning the magnitude of U and V, one can, over time, allow species of different mass to charge ratio to pass through the spectrometer, thereby obtaining a spectrum of the ion species within the sample material. Generally, during the scanning process, the ratio U/V is kept constant so as to maintain the same band pass. The ions exiting the mass analyzer 125 are detected by detector 145. As shown, controller 140 controls the power applied to the focusing optics and the mass analyzer 125.

Transfer optics are incorporated in various designs of mass spectrometers, such as the instrument described above. The function of the transfer optics is to transfer the ions generated in the ion source into the mass analyzer. The transfer optics can be used to extract the ions from the ion source and focus the ions into a beam that is then transferred into the mass analyzer. The transfer optics can also be used to bridge the pressure difference between the pressure inside the ion source 110 and the pressure inside the mass analyzer 125.

As ions exit the ion source and enter the transport optics, some ions may be deposited on the electrodes at the inlet of the assembly. If an insulating deposit is formed, a surface charge may result, which would lead to modified electric fields and degraded performance. The charge build-up leads to modified electrical field within the transport assembly, thereby degrading its performance.

Accordingly, there is still a need for an improved and effective transfer optics.

SUMMARY

The following summary is included in order to provide a basic understanding of some aspects and features of the disclosure. This summary is not an extensive overview of the invention and, as such, it is not intended to particularly identify key or critical elements of the invention or to delineate the scope of the invention. Its sole purpose is to present some concepts of the invention in a simplified form as a prelude to the more detailed description that is presented below.

Embodiments of the invention address the issues present in the prior art and enable simplified fabrication of an ion transfer optics assembly. According to disclosed embodiments, the ion optics assembly is formed by four quarter-circular profile elements, all of which are attach to the same reference plate. Consequently, all four elements remain aligned to the same reference plate. The four elements form a quarter-circular channel with quarter-circular quad electrodes. The quad electrodes receive electrical potential to form the field required to focus and maintain the ions at the center of the channel. Quarter-circular insulators are provided on all sides of the channel so as to seal the channel over its length to prevent gas leakage into the interior of the mass spectrometer. A heater is provided at the entrance to the ion transfer optics, to prevent accumulation of ions on the poles. A thermal break is provided in the quad, so as to enable maintaining the front of the quad heated and the rest of the quad cooler.

BRIEF DESCRIPTION OF THE DRAWINGS

Other aspects and features would be apparent from the detailed description, which is made with reference to the following drawings. It should be appreciated that the detailed description and the drawings provides various non-limiting examples of various embodiments of the invention, which is defined by the appended claims.

FIG. 1 is a schematic of a quadrupole mass spectrometer which may be adapted for implementing embodiments of the invention.

FIG. 2 is a plot illustrating the ion separation action of the quadrupole mass spectrometer of FIG. 1.

FIG. 3 is a schematic illustrating ion transfer optics assembly according to an embodiment of the invention.

FIG. 4 is a cross-section of an ion transfer optics assembly according to embodiments of the invention.

DETAILED DESCRIPTION

Figure 5:
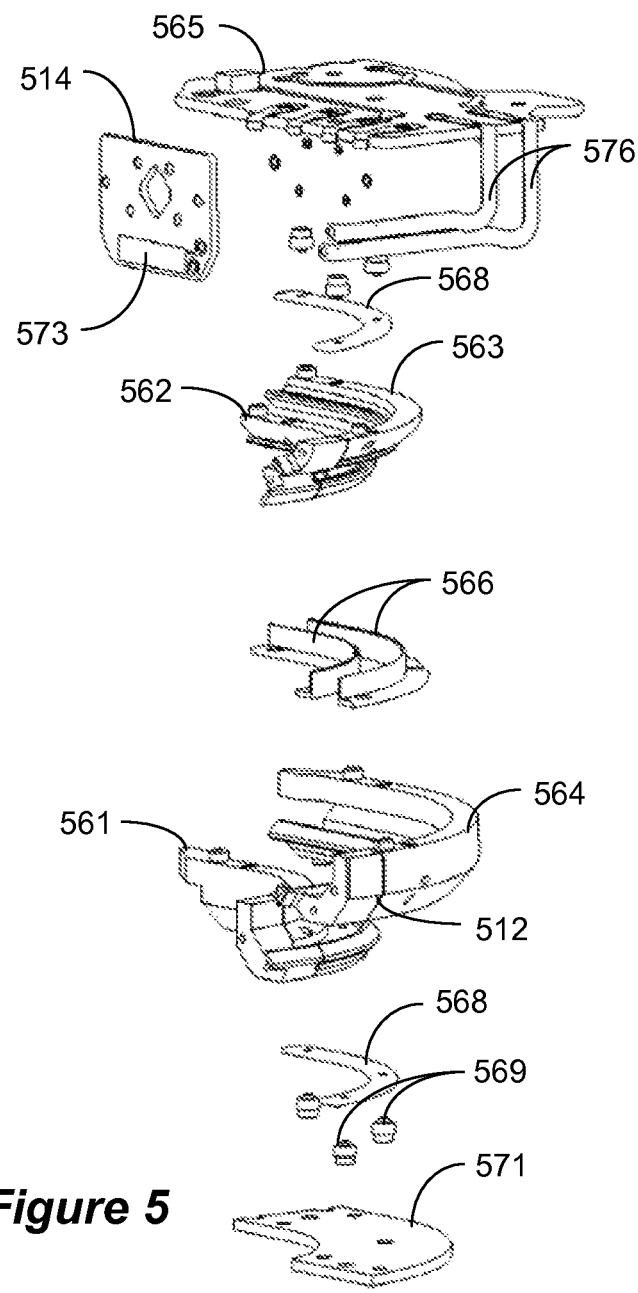
FIG. 5 is an exploded view of the ion transport optics assembly according to a disclosed embodiment.

The embodiments disclosed herein provide an ion transfer optics assembly for a mass analyzer. The disclosed assembly is easier and cost effective to fabricate, yet maintains high alignment of the analyzer's poles. The embodiments illustrated and described are for a quadrupole, but it should be appreciated that it is equally applicable for fabricating other multi-pole assembly having, e.g., hexapole, octapole, etc. The assembly constructed according to embodiments of the invention may be used in any mass spectrometer type where the ions are transferred from an ion source to a mass analyzer.

The details of an embodiment of the invention will now be described with reference to the drawings. FIG. 3 illustrates parts of a mass spectrometer relevant to the embodiment. Various ions from the ion source enter ion transfer optics assembly 315 and are focused at the transfer axis of the assembly 315. The poles of the ion transport assembly are shaped as a quarter circle, or a 90 degree turn. The ions then exit the assembly 315 and enter the mass analyzer 325. In the assembly 315, the ions travel at the center, i.e., the transfer axis of the assembly by a field imposed by the poles, which are energized by power source 342. The ions in the mass analyzer are separated according to their mass to charge ratio (m/z) by a field generated by the poles, which are energized by power generator 340.

The transport assembly 315 includes a thermal break 312, so that the poles at the inlet to the assembly can be heated, while maintaining the rest of the assembly at reduced temperature. In this sense, the assembly is made of inlet quad 313 and transport quad 311. The inlet quad 313 is heated by ceramic heater 314, which is powered by power source 344. The power source 344 may be coupled to a resistive heater attached to the ceramic heater 314.

In this embodiment, the ion transfer optics assembly 315 is formed of four quarter-circular conductive elements that form the required field for the ion transport. The four elements are made of conductive material and are attached to a common insulating plate, so that their alignment is referenced to a single plane. This ensures accurate alignment of the poles during fabrication, so that the field is well controlled. The inlet quad 313 is electrically connected to the transport quad 311, such that both quads receive the same electrical power. Alternatively, the inlet quad and the transport quad may receive different RF and DC potential biases, such that they can manipulate and focus, accelerate or decelerate ions during transport.

FIG. 4 is a cross-section along the line A-A of FIG. 3. Each of the electrodes 461-464 of the quad assembly is made of a conductive quarter-circular element, having a profile that terminates to form one of the electrode faces 467 of the quad. All four elements 461-464 are attached to insulating plate 465, as exemplified by bolts 470. In this manner, all of the quad elements have a common reference plane for the alignment of the quad electrode surfaces 467. This ensures proper alignment at assembly and during operation at various temperatures.

In the illustrated embodiment, the ion source is maintained at higher pressure than the mass analyzer. Therefore, the assembly is used as an intermediate pressure stage between the ion source and the mass analyzer. Additionally, in various applications it is desirable to have the ions entering the transport assembly collide with low mass gas molecules, so as to reduce the energy of the ions. The assembly 315 includes seals that seal the area around the field generating surfaces 467 of the quads, thus forming a narrow tunnel about the axis of transport of the ions. The gas seals are provided to confine the injected gas to the volume defined by the electrodes. As seen in the cross-section of FIG. 4, four elongated seals are provided about the quad electrodes, two vertical seals 466 and two horizontal seals 468. Together the four seals generate a sealed tunnel about the axis of ion transport. In this manner, the injected gas is confined to within the tunnel of ion transport. Also, this eliminates the need for end seals, as was done in the prior art. Since the injected gas is confined to the small space within the ion transport tunnel, very little gas needs to be injected so that the injected gas is generally confined to the area of injection and the pressure gradually lowers towards the edge of the transport assembly. The gas is injected, e.g., via inlet 472.

The embodiment of FIG. 4 illustrates a quad electrode arrangement, wherein each of the four elements 461-464 has a profile defining one electrode of the quad. Each electrode is separated from its neighboring electrode by a distance indicated as "g" in FIG. 4. In this embodiment, each of the four elongated seals 466 and 468 is positioned behind one of the gaps at a distance indicated as "d", which is larger than the gap distance g. Also, each of seals 466 and 468 is in the shape of a thin strip. Each of the thin strips is inserted between two electrodes in a perpendicular orientation. This minimizes the capacitance between each two adjacent electrodes. That is, since the seals are in the form of a thin strip oriented perpendicularly to the surface of the electrodes, it does not serve as a dielectric with respect to parasitic capacitance that may exist between the two electrodes.

Since the elongated seals are placed just behind the electrode surfaces, the injected gas is confined to the area of the quad field. Therefore, gas flow can be reduced without changing the collision rate of the ions and injected gas. Consequently, gas leakage from the assembly is minimal.

FIG. 5 is an exploded view of an ion transport optics assembly according to an embodiment that can be employed with a mass spectrometer, such as the one illustrated in FIG. 1. When assembled, the assembly of FIG. 5 corresponds to the assembly illustrated in FIGS. 3 and 4. Plate 565 serves as mechanical support and reference plane for the poles forming the quad assembly. Plate 565 may be made of an insulating material, such as ceramic, and may include provisions for making all necessary electrical contacts to the quads and the heater.

The quad is formed of four quarter-circular curved poles, all attached to the support plate 565. The poles include lower-inner pole 561, upper-inner pole 562, upper-outer pole 563 and lower-outer pole 564. Additionally, a thermal break, 512, divides the quad into an inlet quad 313 and transport quad 311, shown in FIG. 3. Thermal break 512 is in the form of a cut or space between the inlet part and the transport part of each electrode 561-564. Since the transport assembly is in vacuum environment, the thermal break 512 is evacuated and thereby prevents heat transfer from the inlet quad 313 to the transport quad 311. A heater heats the inlet quad so as to prevent ion impact deposits of ions entering the transport assembly. In this embodiment the heater comprises a ceramic plate 514, a resistive heater 573 attached to the ceramic plate 514, and a power source (not shown in FIG. 5) delivering power to the resistive heater via conductors 576.

As shown in FIGS. 3-5, the four electrodes form a square ion transport tunnel, which forms a quarter-circle curve. Four elongated seals are provided to seal the tunnel throughout its length, leaving only the inlet and exit open for gas flow. In this embodiment the seals are provided in the form of two vertical seals 566 and two horizontal seals 568. Spacers 569 are included in this embodiment to support the horizontal seals. Additionally, plate 571 is optionally included in this embodiment to cap the arrangement. Gas, generally helium, is injected into the transport tunnel to cause collision with the ions. Since the tunnel is sealed throughout its length, very little gas flow is needed to cause the collisions. This limits the amount of gas leaking from the transport assembly, thereby obviating the need for apertures at the inlet and exit of the assembly and reducing the load on the vacuum pump.

Figure 6:
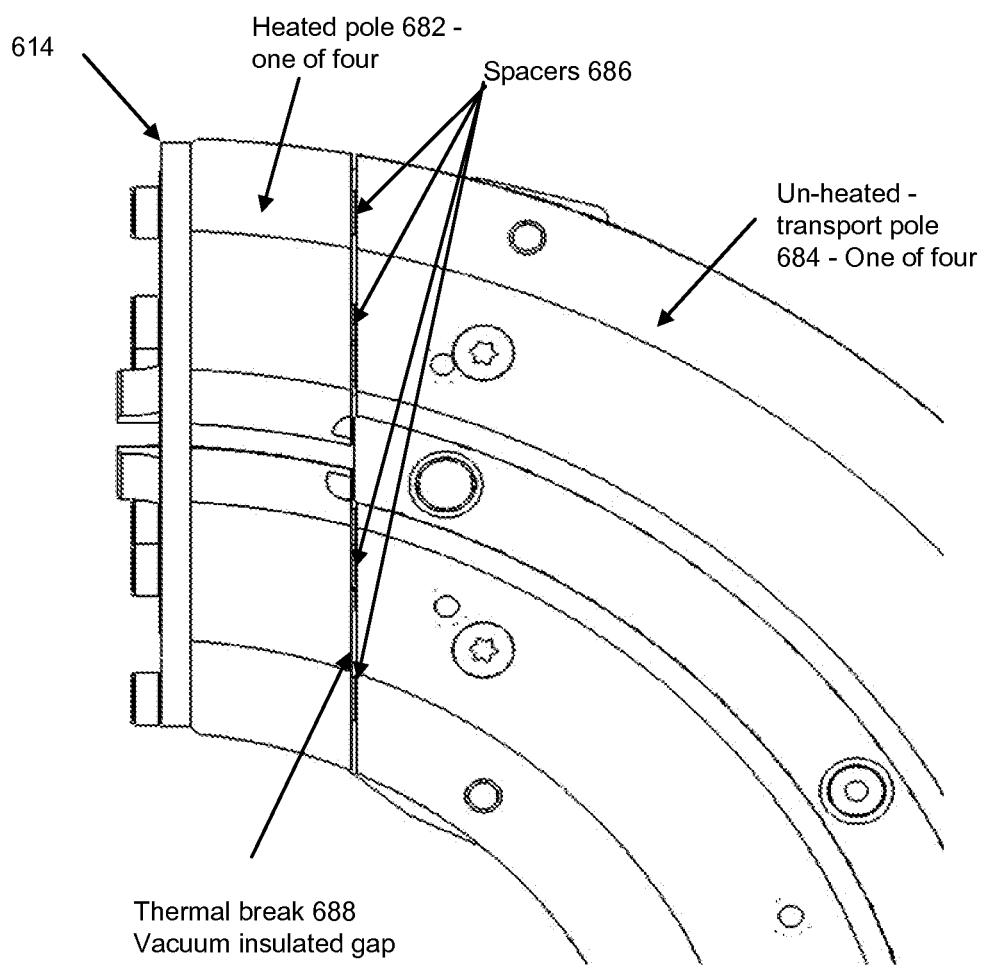
FIG. 6 is a top elevation showing a close-up of the heated section of the ion transport optics assembly according to a disclosed embodiment.

FIG. 6 is a top elevation showing a close-up of the heated section of the ion transport optics assembly according to a disclosed embodiment. As illustrated, the transport assembly is made of two parts—inlet poles and transport poles. FIG. 6 indicates one of four inlet poles 682 and one of four transport poles 684. Spacers 686 can be used to accurately maintain the thermal break 688. Since the transport apparatus is in vacuum, the thermal break 688 is very effective in preventing heat transfer from the inlet poles to the transport poles. The heater plate 614 is used to heat the inlet poles 686. In this embodiment, the insulating plate is not visible, but from the previous figures it could be appreciated that four transport poles are attached to the plate and form an ion transport tunnel. The four inlet poles are thermally insulated from the transport poles and are electrically coupled to the transport poles. The heater is coupled to the inlet poles. Also, in the embodiment disclosed the poles are curved and together form a transport tunnel that makes a 90 degree turn. Of course, the poles may be straight or may form a tunnel that makes a turn of other than 90 degrees.

The above description relates to a specific embodiment of the invention; however, the invention can be implemented using other embodiments to achieve the same improvements and features.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein.

The present invention has been described in relation to particular examples, which are intended in all respects to be illustrative rather than restrictive. Those skilled in the art will appreciate that many different combinations of hardware, software, and firmware will be suitable for practicing the present invention. Moreover, other implementations of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An ion transport assembly, comprising:
    an insulating plate; and
    a plurality of elongated conductive elements, each element having a cross-section configured for forming an electrode surface and further comprising a thermal break forming an inlet portion and a transport portion of the transport assembly;
    wherein all of the elements including the inlet portion and the transport portion are attached to the insulating plate along their length, whereby the electrode surfaces of all of the elements define an ion transport tunnel.

2. The assembly of claim 1, wherein the plurality of elements comprises four elements.

3. The assembly of claim 1, further comprising a plurality of elongated seals provided at the periphery of the transport tunnel to thereby seal the entire length of the transport tunnel.

4. The assembly of claim 3, wherein the plurality of elongated seals comprise a plurality of thin flat strips over the length of the conductive elements.

5. The assembly of claim 3 wherein each of two adjacent electrode surfaces are separated by a gap of length g, and wherein each of the elongated seals is positioned behind a corresponding gap at a distance d of length greater than length g.

6. The assembly of claim 3, further comprising a gas injection inlet enabling gas injection into the ion transport tunnel.

7. The assembly of claim 1, wherein the conductive elements comprise four curved elements forming an ion transport tunnel making a 90 degree turn.

8. The assembly of claim 1, further comprising heater for heating the inlet portion.

9. The assembly of claim 8, wherein the isolation plate comprises electrical contacts to the conductive elements.

10. An ion transport assembly, comprising:
    an insulating plate; and
    four elongated conductive elements comprising a thermal break forming an inlet portion and a transport portion of the transport assembly, all of these being attached to the insulating plate along their length to thereby form an ion transport tunnel, wherein each of the conductive elements is curved such that the transport tunnel forms a 90 degrees turn.

11. The assembly of claim 10, wherein the ion transport tunnel has a square cross-section.

12. The assembly of claim 10, wherein each of the conductive elements comprises a curved element, whereby the conductive elements form a curved transport tunnel making a 90 degrees turn.

13. The assembly of claim 10, further comprising a heater for heating the inlet section.

14. The assembly of claim 13, further comprising four elongated seals, each provided between two of the conductive elements, thereby sealing the transport tunnel throughout its length.

15. The assembly of claim 14, further comprising gas inlet for injecting gas into the ion transport tunnel.

16. The assembly of claim 10, further comprising four elongated seals, each provided between two of the conductive elements, thereby sealing the transport tunnel throughout its length.

17. The assembly of claim 16, further comprising gas inlet for injecting gas into the ion transport tunnel.

18. An ion transport assembly for a mass spectrometer, comprising:
    an insulating plate;
    four transport poles attached to the plate along their length and forming an ion transport tunnel;
    four inlet poles thermally insulated from the transport poles and electrically coupled to the transport poles, the inlet poles being attached to the said insulating plate along their length; and
    a heater coupled to the inlet poles.

19. The assembly of claim 18, further comprising four elongated seals, each seal provided between two of the transport poles so as to seal the transport tunnel over its length.

20. A method for fabricating an ion transport assembly, comprising:
    (a) obtaining an insulating plate;
    (b) attaching to the insulating plate four transport poles and four inlet poles, each along their length;
    (c) electrically connecting the inlet poles to the transport poles, while providing a thermal break between the inlet poles and the transport poles; and
    (d) coupling a heater to the inlet poles.

21. The method of claim 20, further comprising inserting each of four elongated seals between two of the transport poles so as to seal the transport tunnel over its length.

* * * * *